United States Patent [19]

Marks

[11] Patent Number: 5,520,747
[45] Date of Patent: May 28, 1996

[54] FOLDABLE LOW CONCENTRATION SOLAR ARRAY

[75] Inventor: Geoffrey W. Marks, Santa Barbara, Calif.

[73] Assignee: Astro Aerospace Corporation, Carpinteria, Calif.

[21] Appl. No.: 236,426

[22] Filed: May 2, 1994

[51] Int. Cl.$^6$ ............................................. H01L 31/045
[52] U.S. Cl. ........................... 136/245; 136/246; 136/292; 244/173
[58] Field of Search ................... 136/245–246, 136/292; 244/173

[56] References Cited

U.S. PATENT DOCUMENTS

| | | | |
|---|---|---|---|
| 3,170,471 | 2/1965 | Schnitzer | 52/2.19 |
| 3,600,257 | 8/1971 | Feinhardt | 428/118 |
| 3,677,508 | 7/1972 | Dillard et al. | 244/173 |
| 3,837,924 | 9/1974 | Baron | 136/244 |
| 3,912,380 | 10/1975 | Klein | 359/348 |
| 4,282,394 | 8/1981 | Lackey et al. | 136/245 |
| 4,384,163 | 5/1983 | Rauschenbach et al. | 136/245 |
| 4,394,529 | 7/1983 | Gounder | 135/245 |
| 4,554,038 | 11/1985 | Allard | 156/196 |
| 4,598,007 | 7/1986 | Kourtides et al. | 428/116 |
| 4,685,608 | 8/1987 | Kujas | 228/227 |
| 4,686,322 | 8/1987 | Kujas | 136/245 |
| 4,749,601 | 7/1988 | Hillinger | 428/73 |
| 4,811,034 | 3/1989 | Kaminskas | 343/915 |
| 5,076,700 | 12/1991 | DeCaprio | 359/848 |
| 5,196,857 | 3/1993 | Chiappetta et al. | 343/881 |

FOREIGN PATENT DOCUMENTS 4-146897  5/1992  Japan ..................................... 136/245

OTHER PUBLICATIONS

R. V. Elms, Jr., *Conference Record, 13th IEEE Photovolatic Specialists Conf.* (1978), pp. 208–214.

*Primary Examiner*—Aaron Weisstuch
*Attorney, Agent, or Firm*—Loeb and Loeb

[57] ABSTRACT

A low concentration solar array for spacecraft and other uses which has a series of solar panels which can be deployed from a folded stowed configuration to a planar configuration. When the solar panels are stowed, the padding of reflector panels cushions and protects the solar panels from the stresses and vibrations of launch and space flight. Once the solar panels are extended into a deployed planar configuration, the reflector panels are raised to concentrate sunlight upon the solar panels. These reflector panels are constructed from rigid honeycomb substrates and therefore are the active structural members of the solar array, providing the structural rigidity for the solar array.

18 Claims, 6 Drawing Sheets

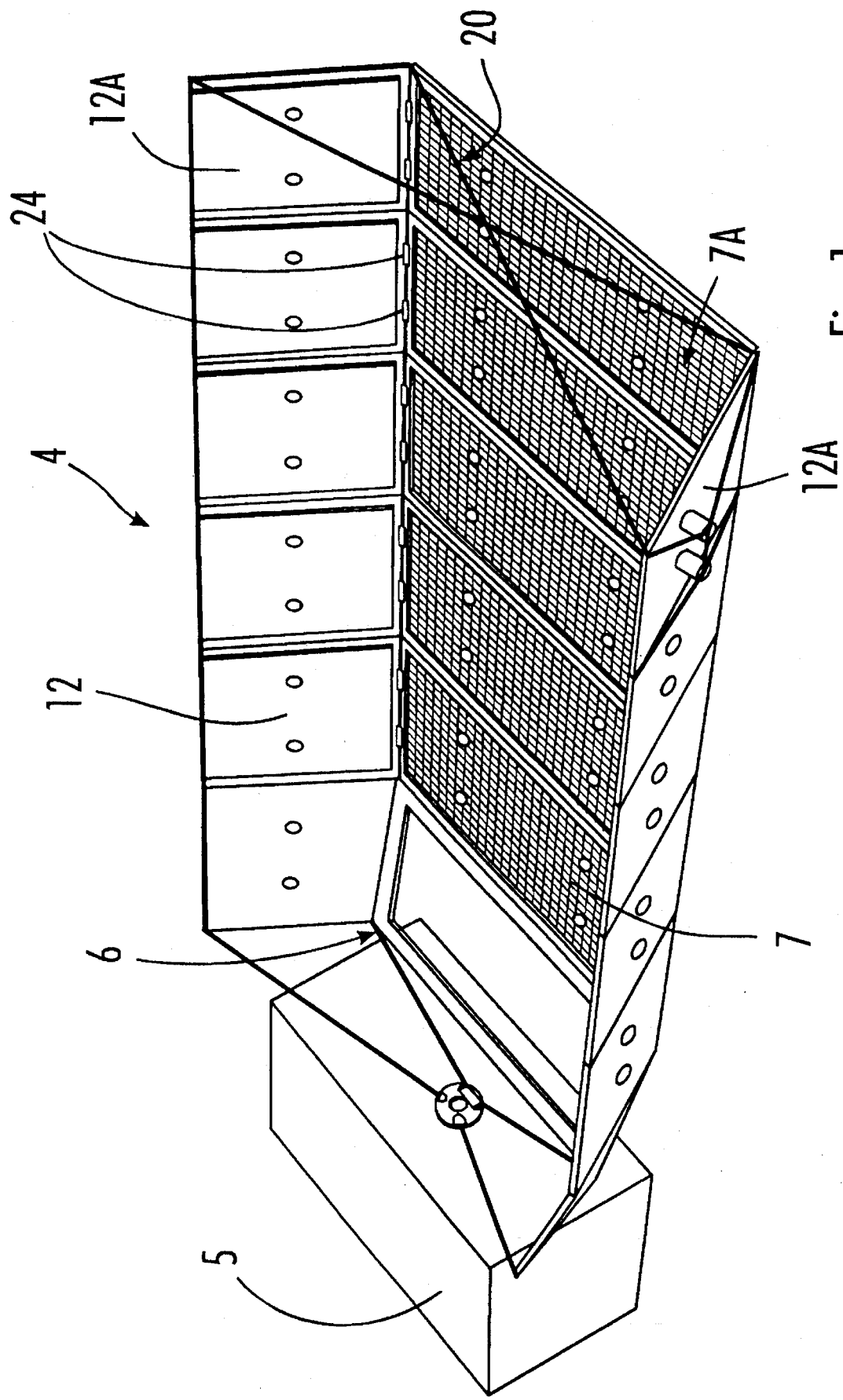

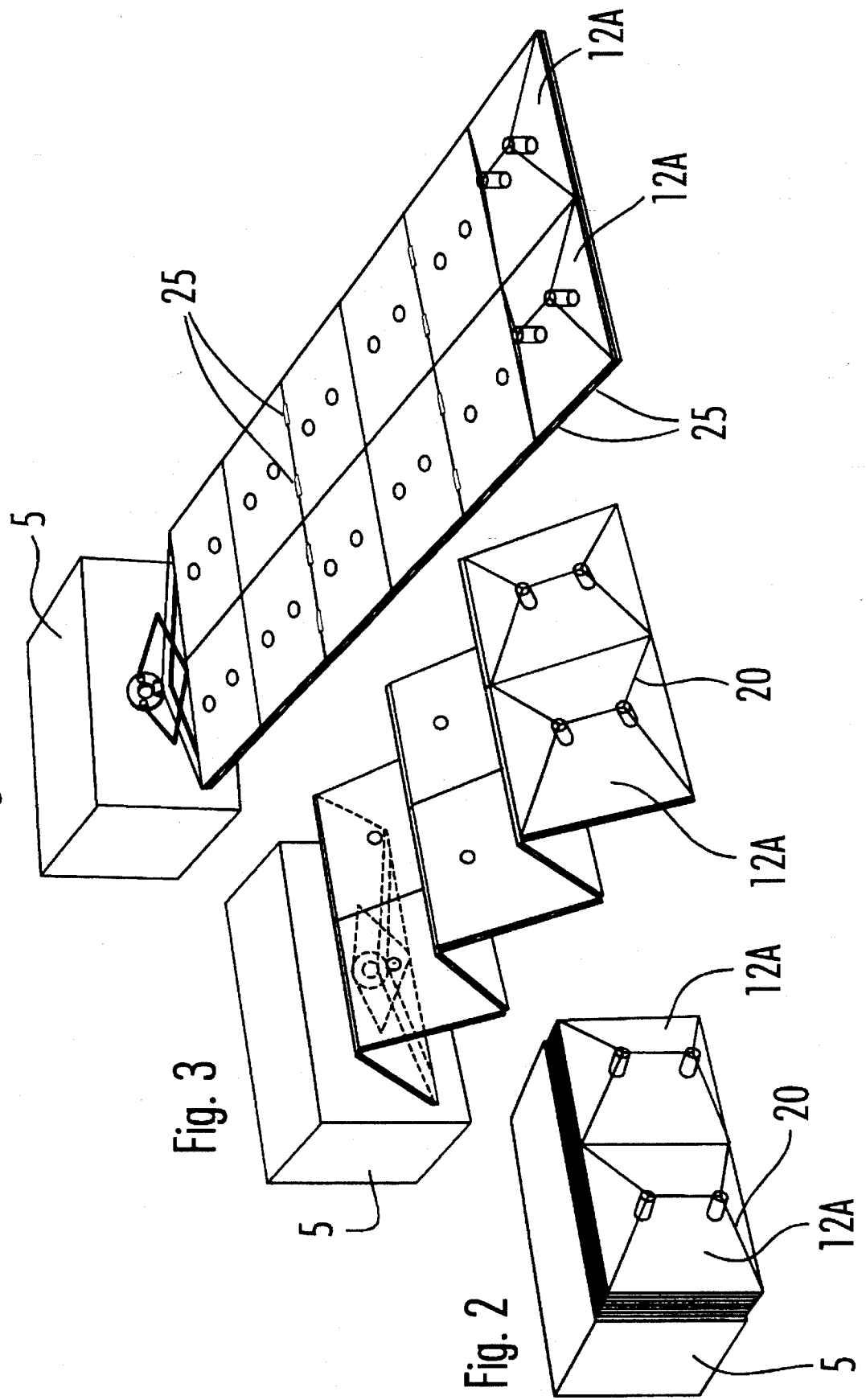

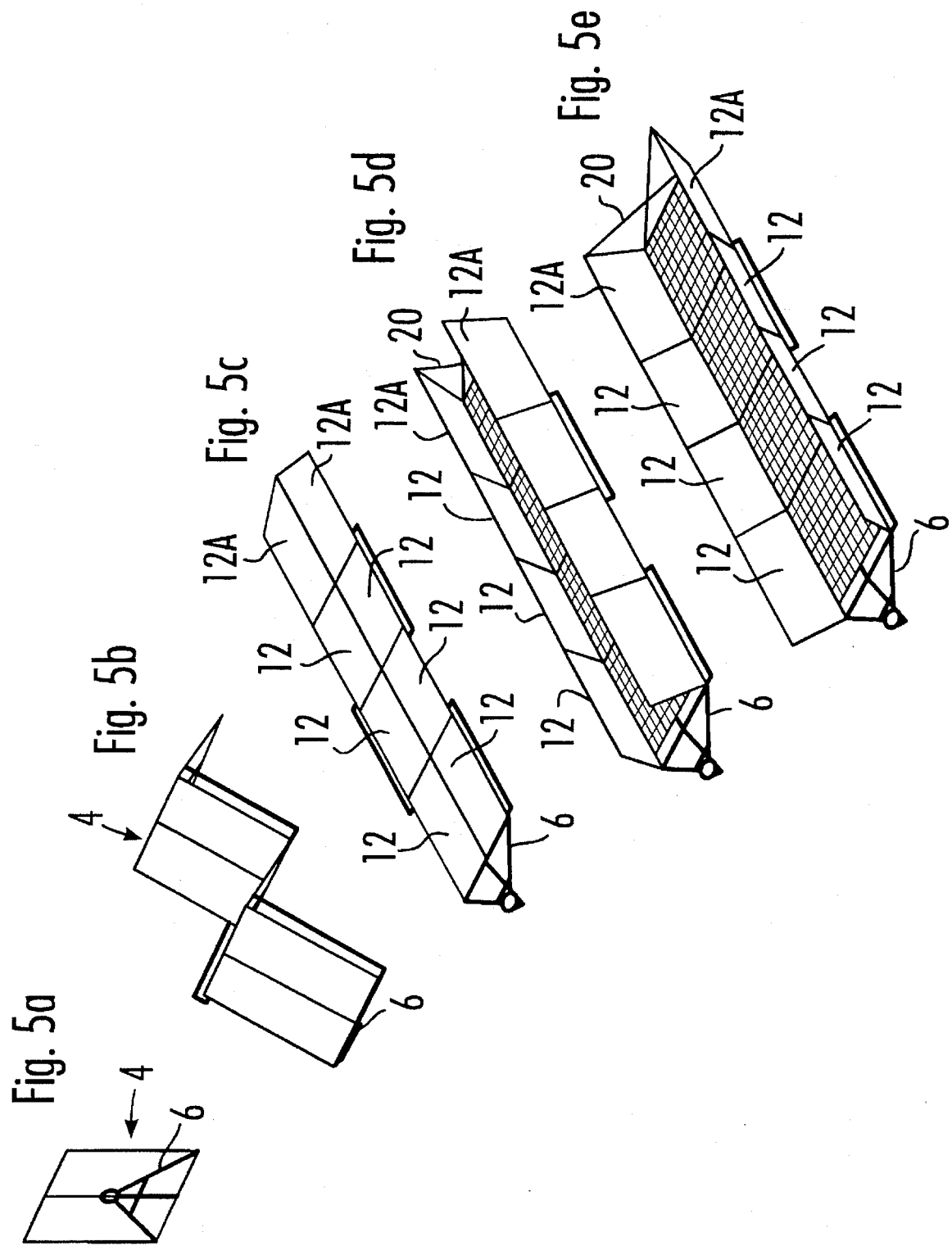

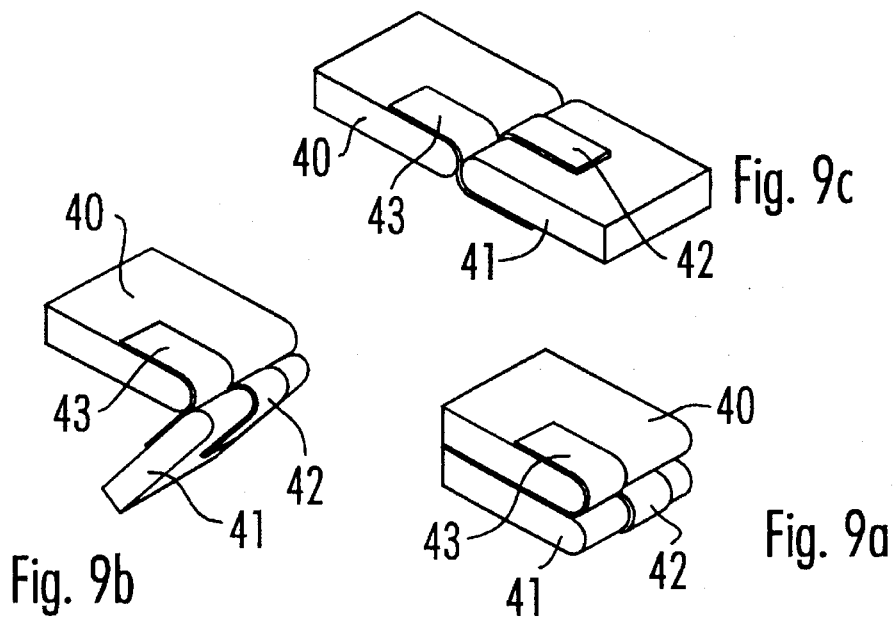
Fig. 9c
Fig. 9b
Fig. 9a
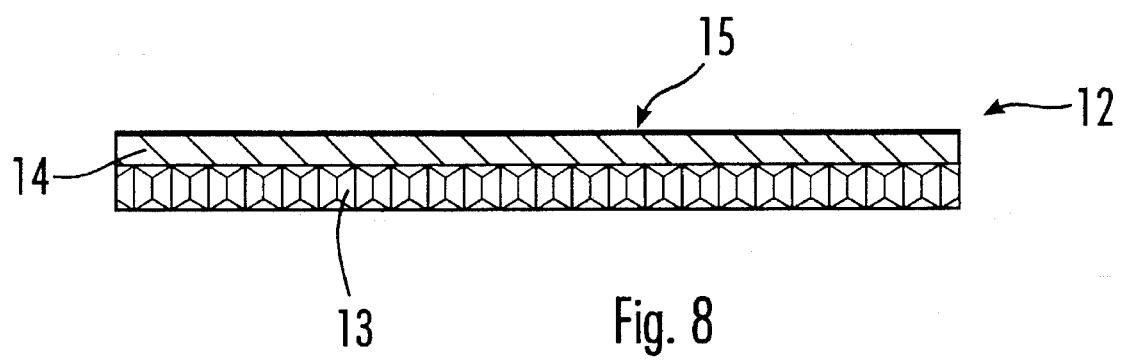
Fig. 8
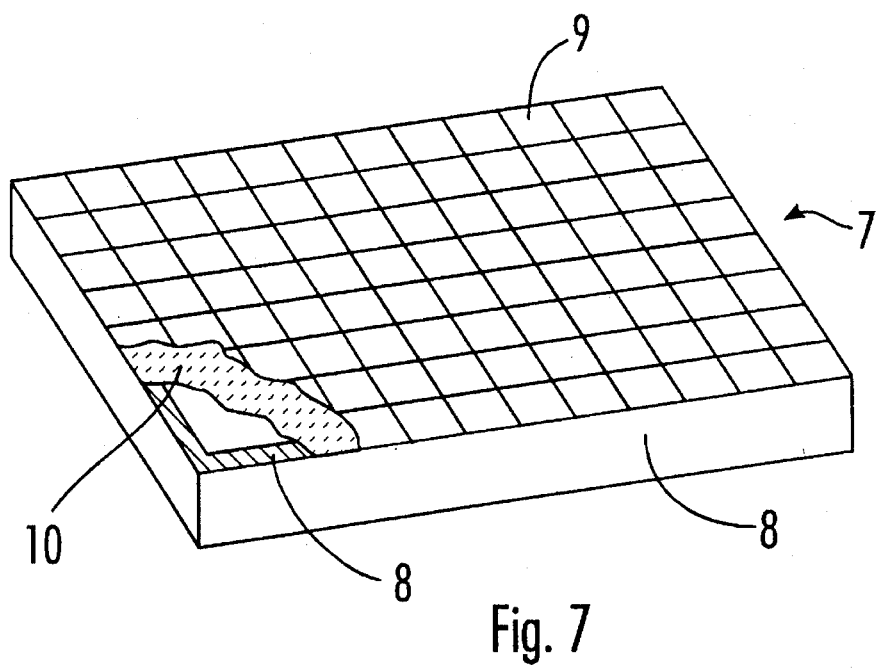
Fig. 7

FOLDABLE LOW CONCENTRATION SOLAR ARRAY

BACKGROUND OF THE INVENTION

1. Field of the Invention

This invention relates generally to a foldable solar array and, in particular embodiments, to a folding low concentration solar array that can be deployed and retracted from a space-based support structure.

2. Description of Related Art

Various folding concentration solar array designs have been developed for connection to the body of a spacecraft. Typically, such foldable arrays are composed of a series of solar panels connected edge-to-edge lengthwise by hinge attachments. U.S. Pat. No. 3,667,508 describes a foldable solar array, wherein reflectors are attached widthwise to the opposite ends of each solar panel. U.S. Pat. No. 4,686,322 describes reflectors which are used in conjunction with solar panels.

Such solar arrays may typically be mounted upon deployment booms or yokes which can be extended or retracted from spacecrafts. When the solar array is stowed, such as during the launch of the spacecraft, the reflectors are folded over their respective solar panels and the solar panels are folded together in an accordion-like fashion against or within the spacecraft. When the solar array is fully deployed, the solar panels are disposed in substantially a common plane and the reflectors are folded away from these panels, into a position which concentrates sunlight upon the solar panels.

Typically, such solar arrays include one or more panels supporting solar cells for generating electrical power for a spacecraft or the like. As such, the solar panels of each array must be adequately protected to ensure their proper and continuous function throughout a space mission. For example, during the launch of a spacecraft, the solar panels may be subjected to extreme stresses and vibrations. After the spacecraft has reached space, and during or following deployment of the solar array, the array may be subjected to further stresses and forces which may damage the solar panels. In addition, when the solar array is in a deployed configuration the extreme heat of the sunlight often causes thermal stresses in the solar panels.

In some previous designs of concentration solar arrays, the loads and stresses which normally occur during a spacecraft launch and the deployment of the array itself have been borne by the solar panels. The solar panels in these designs are the structural support members of the solar array. For example, a paper entitled "Retractable Planar Space Photovoltaic Array" presented at the 21st IEEE Photovoltaic Specialists Conference, May 21–25, 1990 ("the IEEE paper") describes a concentration solar array with solar panels constructed from honeycomb panels. This honeycomb structure presumably allows the solar panels to withstand high stresses and loads which are typically borne by structural support members.

The drawback of such a system is that the solar panels, being the structural support members of the solar array, are subjected to much structural and thermal stress and strain during space flight, deployment and retraction. This is undesirable because the solar cells which are disposed on the solar panels can be relatively fragile and sensitive to these stresses and strains. To function as a primary structural support member of the solar array, each solar panel must have a construction suitable to withstand the above-noted stresses and strains. As a result, such solar panels can be relatively heavy, expensive and difficult to repair or replace. However, despite these drawbacks, the industry has continued to rely on the structural integrity of the solar panels to function as the primary or sole structural support members of the solar array.

The tendency to rely upon the solar panels as the primary structural support member is further illustrated in various references, such as U.S. Pat. Nos. 4,394,529 and 4,686,322. The '529 patent describes a solar panel which is comprised of an array of stiffening beams. The '322 patent discloses a number of substrates for solar panels, all of which are honeycomb panel structures for structural strength. Reinforcement ribs are often added to these honeycomb panels to increase the strength and rigidity of the panels in the stowed and deployed configurations.

Folding concentrator style solar arrays have also presented a problem with regard to the protection of the individual solar panels when the array is in a stowed configuration. When the solar array is stowed—that is, when the reflector panels are folded over the solar panels and the array is folded together in an accordion-like fashion—it is necessary to prevent the reflectors or other panels from impacting the solar cell surfaces. In some cases, such as the retractable solar array disclosed in the above IEEE paper, the reflector is designed to avoid touching the solar panels in the stowed configuration.

SUMMARY OF THE DISCLOSURE

A solar array according to a preferred embodiment of the present invention is composed of a plurality of solar panels attached to each other via reflector panels and a series of hinged connections. In preferred embodiments, each solar panel is comprised of solar cells affixed to a film sheet which is stretched across a light-weight frame or a lightweight honeycomb panel. Each solar panel is supported between a pair of reflector panels attached widthwise at hinged connections to opposing sides of the solar panel such that the combination of the two reflector panels and the solar panel provide effectively a stiff, deep channel section structure. Each reflector panel is formed of a lightweight honeycomb panel upon which is mounted padding covered with a reflective coating. The reflective coating on the padding directs sunlight onto the solar panels, thereby increasing the energy output from these panels. Typically, additional sunlight from the reflectors increases the power output of the solar panels by approximately 50 percent. The solar array is kept initially in a stowed state whereby the reflector panels are folded over their respective solar panel, and the solar panels are folded in an accordion-like fashion.

According to preferred embodiments of the present invention, each solar panel is supported between two reflector panels via hinge connections between the solar panel and the two reflector panels. Adjacent reflector panels are connected to each other via hinge connections, while adjacent solar panels need not be (and preferably are not) directly connected to each other for support. In this matter, the reflector panel structure supports the solar array in its deployed and partially deployed states.

In preferred embodiments, the honeycomb panel structure of the reflectors provides an improved structural stiffness and strength to the overall solar array in the stowed state, and therefore provides improved protection of the solar panels during launch of the spacecraft. Additionally, in the stowed configuration, the padding of the reflectors in preferred embodiments is in contact with and pressed against the solar panels, providing cushioning and protection.

The honeycomb reflector panel structure also provides stiffness and strength to the overall structure of the solar array when it is fully deployed. When a solar array is in a deployed configuration, the array should resist forces that would cause the solar panels and/or reflectors to twist or fold such that they would no longer be planar. This would result in lower absorption of sunlight by the solar panels and a resultant decrease in electric power generation. Likewise for the reflectors, any unnecessary twisting or folding would adversely affect the amount of sunlight reflected or concentrated on the solar panels and lead to a reduction in power generation. The honeycomb panel structure of the reflectors and the use of the reflectors as structural support members of the solar array greatly improves the solar array's ability to withstand such forces and to remain generally planar without requiring relatively heavy, difficult-to-manufacture and repair solar panels of the type discussed in the Background section.

BRIEF DESCRIPTION OF THE DRAWINGS

In the drawings:

FIG. 1 is a perspective view of a solar array according to a preferred embodiment of the invention wherein the solar array is in a fully deployed state;

FIG. 2 is a perspective view illustrating the solar array of FIG. 1 in a stowed state where the solar panels and reflector panels are tied down to the spacecraft;

FIG. 3 is a perspective view showing the solar array of FIG. 1 between its deployed and retracted states;

FIG. 4 is a perspective view illustrating the solar array of FIG. 1 in a partially deployed state where the reflectors have not been raised into an open position away from the solar panels;

FIGS. 5a–5e are perspective views of a solar array in various stages of retraction and deployment.

FIG. 7 is a cut-away perspective of a solar panel according to a preferred embodiment of the invention.

FIG. 8 is a cross-sectional view of a reflector according to a preferred embodiment of the invention;

FIGS. 9a, 9b and 9c are perspective views of spring hinges.

DETAILED DESCRIPTION OF THE INVENTION

The drawings illustrate a foldable low concentration solar array 4 according to a preferred embodiment of the present invention mounted onto a support structure 5. The support structure 5 will generally be the body of a spacecraft, such as a satellite. However, in further embodiments, the support structure 5 may be any other suitable structure, including but not limited to, an orbital space station, space, water or land vehicle, or other floating, underwater or land based structure.

Figure 10:
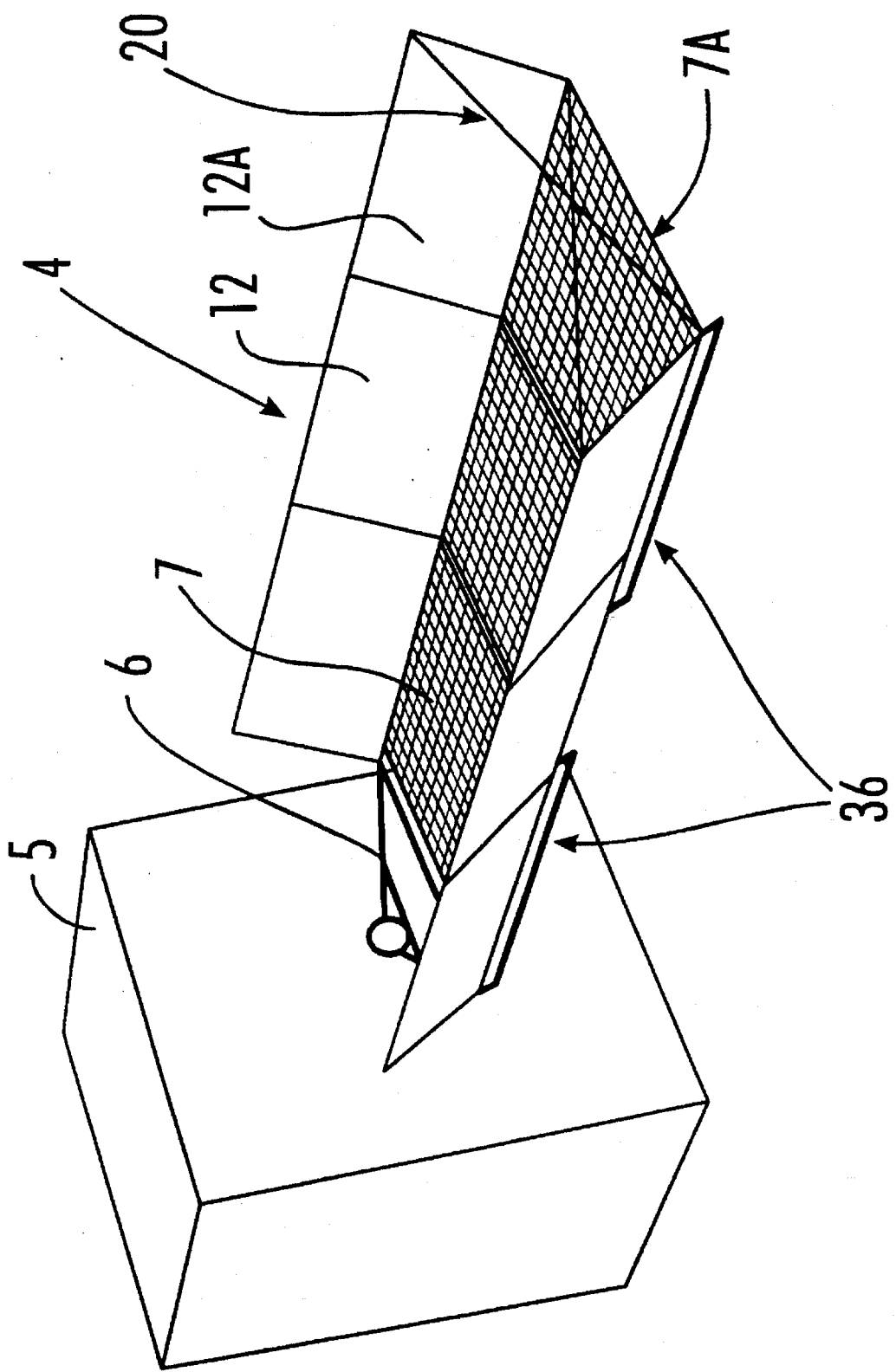
FIG. 10 is a perspective view of a solar array wherein the solar panels are spaced apart from each other.

FIG. 1 shows the solar array 4 in a fully deployed configuration, while FIGS. 2–4 show the solar array 4 in various stages of deployment. The solar array 4 has a series of folding solar panels 7. The solar panels 7 are attached via hinge attachments 24 to reflector panels 12. The reflector panels 12 are interconnected to each other using hinge attachments 25. These hinge attachments 24 and 25 allow the panels to fold relative to each other in an accordion-like fashion as shown in FIG. 3. That is, each panel hinge attachment 25 pivots in the opposite direction of the next adjacent panel hinge attachment in the series of panels 12. The solar panels 7 are preferably each supported between a respective pair of reflector panels and are indirectly connected to at least one adjacent solar panel through hinge connections between adjacent reflector panels 12. Adjacent solar panels may abut each other, e.g., for added stability, in the deployed stated (as shown in FIG. 1), or may be spaced from each other (as shown in FIG. 10).

The reflector panels 12 are attached to a deployment boom 6. The deployment boom 6 operates to deploy or to retract the entire solar array 4. Any suitable type of deployment boom may be utilized. By way of example, various stages of a deployment operation according to one embodiment of a deployment boom 6 are shown with reference to FIGS. 5a–e, wherein FIG. 5a shows a fully-stowed configuration, FIG. 5b shows a partial-deployment-of-the-solar-panels configuration, FIG. 5c shows a full-deployment-of-the-solar-panels configuration, FIG. 5d shows a partial-deployment-of-the-reflector-panels configuration and FIG. 5e shows the solar array in a fully-deployed configuration.

Figure 6A:
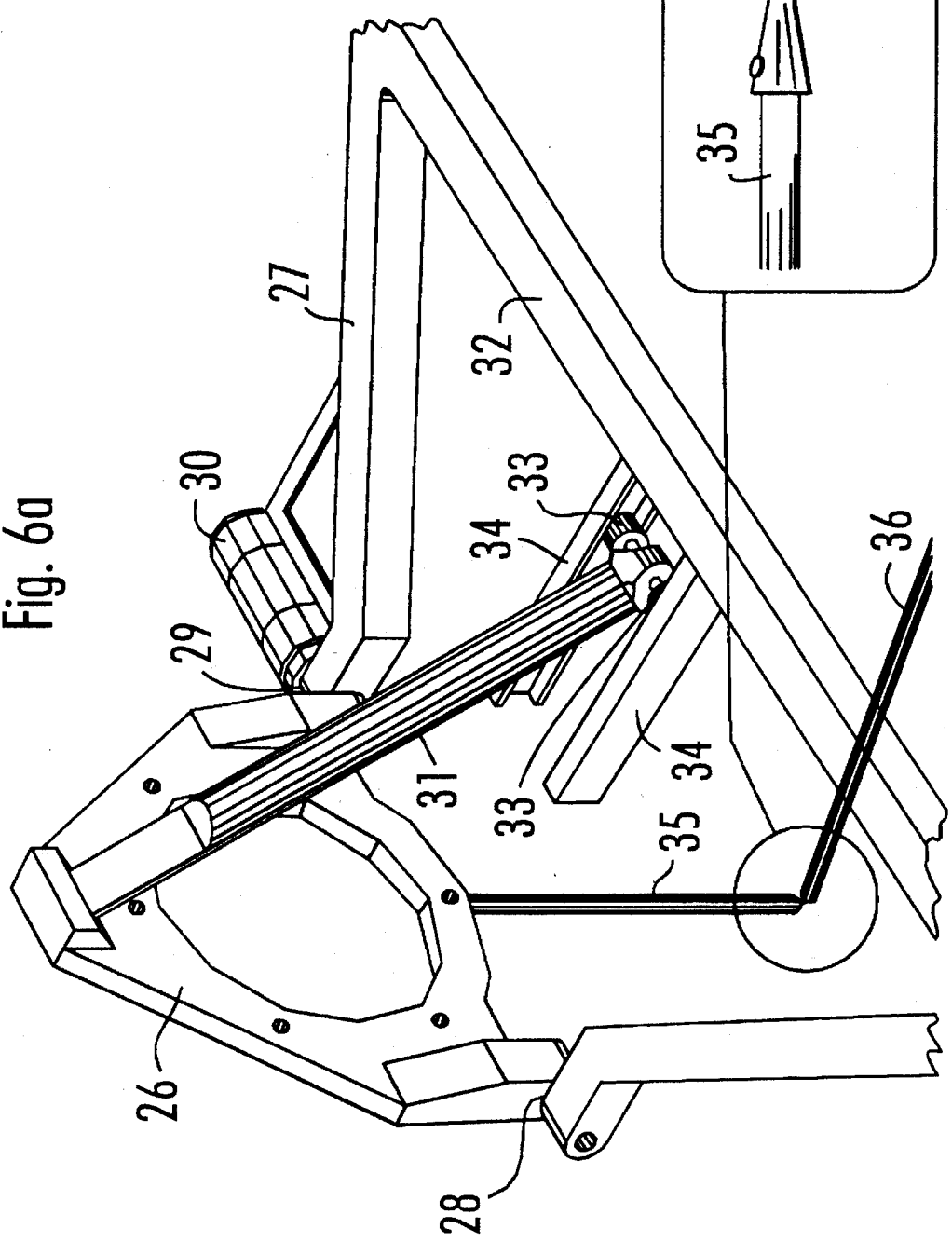
FIG. 6 is a partial perspective view of a yoke structure and deployment coordination linkage.
Figure 6B:
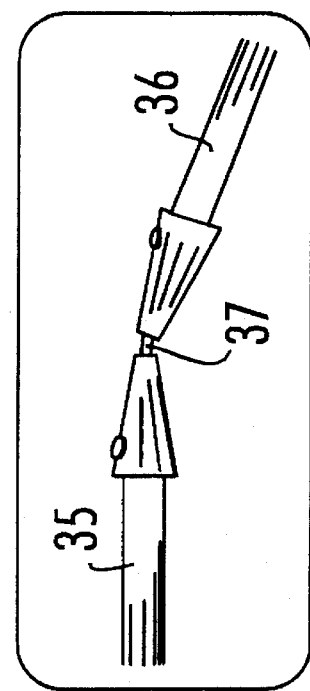

An embodiment of a portion of the yoke structure and deployment coordination linkage of a deployment boom is shown in FIG. 6, wherein a mounting flange 26 couples the yoke structure 27 to a support structure (not shown in FIG. 6), such as the support structure 5 discussed above. The yoke structure 27 is pivotally coupled to the flange 26 at pivot links 28 and 29. A damper 30 may be provided at one or both pivot links 28 and 29 for helping to smooth transitions between stowed and deployed configurations.

A latching stabilization link rod 31 is coupled between a cross member 32 of the yoke structure 27 and the flange 26. In particular, one end of the rod 31 is pivotally coupled to the flange 26, while the other end of the rod is coupled to a pair of rollers 33. The rollers 33 roll within a pair of guide rails 34 extending from the cross member 32 during a transition between stowed and deployed configurations. A latching arrangement, for example, a set of ridges or other discontinuities, may be provided in the rails 34 for engaging the rollers 33 at a preselected location, so as to latch the rod 31 at a particular deployment angle.

A deployment coordination linkage structure includes a pair of tubular members 35 and 36, coupled together end-to-end by a flexible cable 37, such as a Kevlar cable. Tubular member 35 is attached to the mounting flange 26 and tubular member 36 is attached to the panels.

Referring to FIG. 7, each solar panel 7 of the solar array 4 is, in a preferred embodiment, comprised of a honeycomb core substrate with a nonconducting (electrically insulating) face sheet to which the solar cells are adhesively bonded.

The solar panel 7 may also include further features such as protective covers (not shown) for the solar cells 9, electrical wiring (not shown) for interconnecting the individual solar cells 9, and cabling and harnesses (not shown) to collect the power generated by the solar cells and to transfer this power to the spacecraft.

Referring to FIG. 8, the reflector 12 comprises a lightweight, structurally rigid panel with a honeycomb structure 13. Honeycomb panel structures are well known in the art, and therefore any suitable honeycomb construction may be used in the reflector 12. Padding 14 is mounted on the honeycomb panel structure 13. In preferred embodiments, the padding 14 is a foam padding. A reflective coating 15 covers the surface of the padding 14 which faces the solar panel 7 and which contacts the solar panel 7 when stowed.

The hinge attachments 24 allow the reflectors 12 to be folded atop the solar panel 7 or to be raised into an open position away from the surface of the solar panel 7. An embodiment of a suitable hinge structure is shown in FIGS. 9a–c, wherein a pair of hinge bodies 40 and 41 are coupled together by one or more strips of flexible tape 42 and 43. The flexible tape hinges can be combined with springs (not shown) having a spring force constantly urging the hinge bodies toward the deployed (or unfolded) configuration shown in FIG. 9c.

The launch of a spacecraft can induce severe stresses and vibrations on a solar array stowed within or on the craft. Therefore, in a stowed state, as shown in FIG. 2, the solar panels 7 and reflectors 12 are folded into a compact and stable configuration and tied down to the support structure. In particular, the reflectors 12 are first folded atop their respective solar panels 7 as depicted in FIG. 4. In this position, the padding 14 of the reflectors 12 comes into contact with the surface of the solar panels 7. The solar panels 7 and reflectors 12 are then folded back toward the support structure 5 in an accordion-like fashion. After the outermost solar panel 7 is folded flat against the support structure 5, the folded solar array 4 is tied down to the support structure. The tie down procedure presses the padding 14 of the reflectors 12 against the solar panels 7, creating a stiff, highly damped stowed package. The solar panels 7 and the solar cells 9 are thus well cushioned and protected from vibration and stresses.

Referring to FIGS. 3 and 4, after the spacecraft has achieved orbit, the deployment boom 6 is extended outward from the support structure 5 in order to deploy the solar array 4. In preferred embodiments, the deployment boom 6 is deployed outward by means of a drive mechanism comprising a spring damper system or a motor and cabling or coordinating rod system (not shown), each of which are well known in the art. The array of panels 7 and 12 is fully extended when the panels 7 and 12 are disposed in two substantially parallel, adjacent planes as illustrated in FIG. 4.

Referring to FIG. 1, once this parallel plane configuration is reached, springs in hinges 24 lift the reflectors 12 away from the solar panels 7 and into an open position where the reflectors 12 can direct or concentrate sunlight upon their respective solar panels 7. Anchor cables 20 are attached to the distal edges of the outermost solar panel 7a and reflectors 12a. These cables 20 stabilize the distal section of the solar array 4, and maintain the open position of the reflectors 12.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiment is therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A solar array comprising:

a plurality of first support panels coupled end-to-end by hinge connectors, each first support panel having a side edge;

a plurality of second support panels coupled end-to-end by hinge connectors, each second support panel having a side edge; and a plurality of solar panels coupled between the first and second support panels;

each solar panel having at least one solar collector disposed thereon, a first side edge coupled to said side edge of a respective first support panel and a second side edge coupled to said side edge of a respective second support panel, wherein said first and second support panels support said solar panels therebetween.

2. A solar array as recited in claim 1, wherein said plurality of first support panels comprises at least three support panels and wherein said plurality of second support panels comprises at least three support panels.

3. A solar array as recited in claim 1, further comprising a deployment boom coupled to and supporting at least one of said first and second support panels.

4. A solar array as recited in claim 1, wherein each of said solar panels comprises a support frame, a thin film stretched across the support frame and an array of solar cells disposed on said thin film.

5. A solar array as recited in claim 1, wherein each of said solar panels comprises a honeycomb core substrate and an array of solar cells disposed thereon.

6. A solar array as recited in claim 1, wherein each of said support panels comprises a reflective member for reflecting solar radiation onto at least one of said solar panels.

7. A solar array as recited in claim 1, wherein each of said support panels comprises a substrate supporting a padding covered with a reflective material.

8. A solar array as recited in claim 1, wherein said solar panels are coupled to said first and second support panels by hinge connectors, such that at least one hinge connector couples each first support panel to a respective solar panel and at least one hinge connector couples each second support panel to a respective solar panel.

9. A solar array as recited in claim 1, wherein the solar panels arranged end-to-end are spaced apart from each other such that a gap is provided between each pair of adjacent solar panels.

10. A solar array as recited in claim 9, wherein the each pair of adjacent solar panels are free of direct structural connection therebetween.

11. A solar array comprising:

a deployment boom;

a plurality of first support panels supported by the deployment boom and arranged in a first row;

a plurality of second support panels supported by the deployment boom and arranged in a second row;

a plurality of solar panels arranged in a third row, between said first and second row, each solar panel in said third row being spaced apart from each adjacent panel in the third row;

each solar panel coupled to and supported by a respective one of said first support panels and a respective one of a second support panels.

12. A solar array as recited in claim 11, wherein each of said solar panels comprises a support frame, a thin film stretched across the support frame and an array of solar cells disposed on said thin film.

13. A solar array as recited in claim 11 wherein each of said solar panels comprises a honeycomb core substrate and an array of solar cells disposed thereon.

14. A solar array as recited in claim 11, wherein each of said support panels comprises a reflective member for reflecting solar radiation onto at least one of said solar panels.

15. A solar array as recited in claim 11, wherein each of said support panels comprises a substrate supporting a padding covered with a reflective material.

16. A solar array as recited in claim 11, wherein said solar panels are coupled to said first and second support panels by hinge connectors, such that at least one hinge connector couples each first support panel to a respective solar panel and at least one hinge connector couples each second support panel to a respective solar panel.

17. A solar array as recited in claim 11, wherein the each pair of adjacent solar panels are free of direct structural connection therebetween.

18. A method of supporting a plurality of solar panels comprising the steps of:

providing a deployment boom;

supporting a plurality of first support panels in a first row with the deployment boom;

supporting a plurality of second support panels in a second row with the deployment boom;

arranging a plurality of solar panels in a third row, between said first and second row, with each solar panel in said third row being spaced apart from each adjacent panel in the third row;

coupling and supporting each solar panel with a respective one of said first support panels and a respective one of a second support panels.

* * * * *